United States Patent [19]

Nishizawa

[11] 4,317,127
[45] Feb. 23, 1982

[54] STATIC INDUCTION TRANSISTOR AND INTEGRATED CIRCUIT UTILIZING SAME

[75] Inventor: Jun-ichi Nishizawa, Sendai, Japan

[73] Assignee: Zaidan Hojin Handotai Kenkyu Shinkokai, Sendai, Japan

[21] Appl. No.: 76,439

[22] Filed: Sep. 17, 1979

[30] Foreign Application Priority Data

Sep. 28, 1978 [JP] Japan ................................. 53-120122

[51] Int. Cl.³ ..................... H01L 27/04; H03K 19/091
[52] U.S. Cl. ........................................ 357/42; 307/458;
307/477; 357/22; 357/23; 357/43; 357/50;
357/15; 357/92
[58] Field of Search .................... 357/43, 92, 15, 44,
357/46, 22, 23, 41, 42

[56] References Cited

U.S. PATENT DOCUMENTS 4,032,962  6/1977  Balyoz et al. ......................... 357/92
4,160,918 12/1977  Nazarian et al. ..................... 357/92

OTHER PUBLICATIONS

Nishizawa et al, Japanese J. of Applied Physics, vol. 16, supplement 16-1, pp. 151-154, (1977).

*Primary Examiner*—William D. Larkins
*Attorney, Agent, or Firm*—Cushman, Darby & Cushman

[57] ABSTRACT

A static induction type semiconductor device containing a normal type static induction transistor having the structure that a source region, gate regions and drain regions are arrayed in a main surface of a channel-constituting semiconductor region, and that a sub-drain region is formed in the opposite surface of the channel-constituting semiconductor region so as to extend from a position corresponding to the source region up to a position corresponding to the drain regions. The provision of this sub-drain region makes it possible to realize easy isolation of a normal vertical structure static induction transistor in a semiconductor wafer, the normal vertical structure contributing to increasing the transconductance, and to improving the speed of operation, without sacrificing a high packing density.

24 Claims, 25 Drawing Figures

FIG. IA
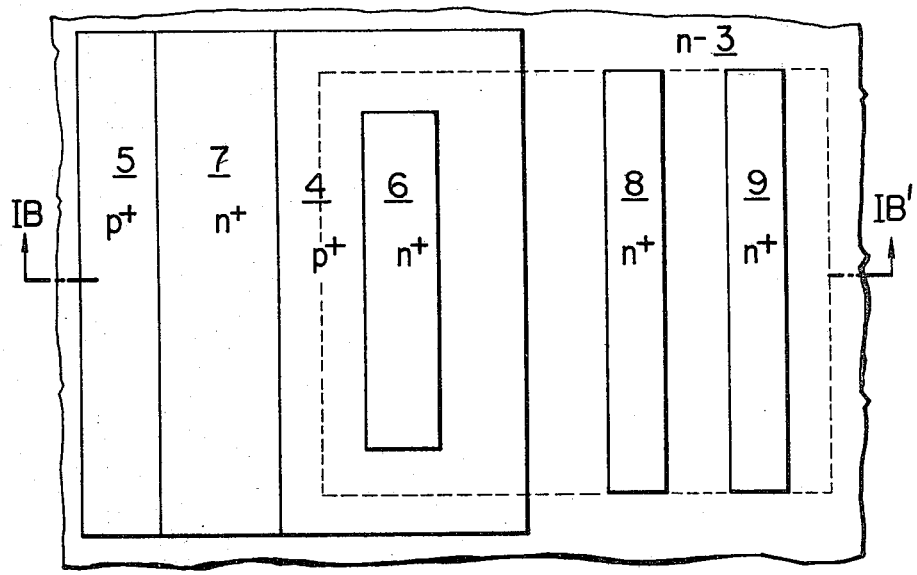
FIG. IB
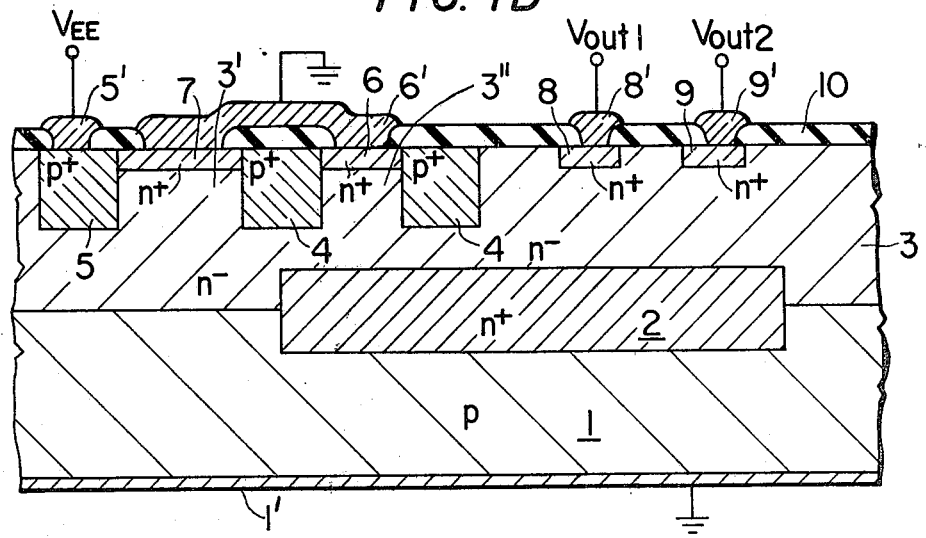

STATIC INDUCTION TRANSISTOR AND INTEGRATED CIRCUIT UTILIZING SAME

BACKGROUND OF THE INVENTION (a) Field of the Invention

The present invention concerns static induction transistor and integrated circuit device utilizing same, and more particularly it pertains to improved normally operated static induction transistor and integrated circuit device utilizing same.

(b) Description of the Prior Art

The static induction transistor proposed by the present inventor may be characterized by its short channel structure and a high resistivity of the channel region. The high resistivity channel region enables one to form a gate-originating depletion region to pinch off the channel region by selecting the value of the gate bias voltage and also the gate-to-gate distance. This gate-to-channel depletion region, when pinching off the channel region, forms a potential barrier for charge carriers travelling between the source and the drain. The short channel structure remarkably reduces the series resistance from the source to the potential barrier, and makes the height of this potential barrier controllable also by the drain voltage, with the assistance of the high resistivity of the channel region. Thus, a static induction transistor realizes unsaturating drain I-V characteristics, as does the vacuum triode tube, in accordance with its operational principle which is to control the potential barrier height by the drain voltage as well as by the gate voltage. Forward biasing of a junction static induction transistor further adds a factor of minority carrier injection from the gate region.

The "pinch-off point" of a static induction transistor has a meaning similar to that of the conventional field effect transistor in the sense that the depletion region traverses the channel region and occupies a total cross section of the channel region at that position, but has a different meaning in the aspect that the pinch-off point in the static induction transistor has a controllable barrier height for those carriers flowing from the source to the drain, whereas the pinch-off point in the conventional field effect transistor has only the extremely narrowed neutral region, but it has no potential barrier. The above difference plus the difference in the magnitude of the series resistance from the source to the pinch-off point serve to produce a remarkable difference in the unsaturating drain I-V characteristics of the static induction transistor and the saturating drain I-V characteristics of the conventional field effect transistor.

A normally-off type static induction transistor is formed by selecting the impurity concentration in the channel region low and the channel width narrow to enable the depletion region due to the gate-to-channel built-in voltage to transverse the channel region and pinch off the current path. Forward bias operation is made possible in such normally-off type static induction transistor, and allows the static induction transistor to advantageously substitute for the bipolar transistor.

An IIL which has been developed as a bipolar logic circuit has the arrangement that the collector electrode of an injector transistor is formed in common with the base electrode of an inverter transistor, and that said inverter transistor is of the upside-down type, and also that the base electrode of this injector transistor is formed in common with the emitter electrode of the inverter transistor. Thus, an IIL has materialized high packing density, high-speed operation and so forth. An IIL type static induction transistor logic circuit which performs a circuit function similar to that of IIL has been proposed and developed also by the present inventor (Electronics Aug. 19, 1976, page 4E), and this circuit exhibits an ability superior to that of the bipolar type IIL. In such known structures, the inverter transistor empolyed has adopted an upside-down type structure, so that these known structures have the drawbacks such that the current injection efficiency and the carrier travelling efficiency from the emitter electrode to the collector electrode or from the source region to the drain region cannot be enhanced substantially. More particularly, in case an upside-down type static induction transistor (SIT) is employed, the drawbacks exist that the transconductance cannot be made large, and that accordingly the operation speed is limited.

SUMMARY OF THE INVENTION

An object of the present invention is to provide an improved normal type static induction transistor which has a source region disposed in a surface portion, a gate region surrounding the source region and providing a pinch-off point near the source region and a drain region disposed also in a surface portion.

Another object of the present invention is to provide an IIL-type static induction transistor integrated circuit device which employs a normal type static induction transistor to serve as an inverter transistor, to enable operation of a higher speed.

A normal type SIT having the arrangement that its source region is provided in one main surface of a semiconductor wafer and that the area of its drain region is larger than that of the source region is difficult to be made into a multi-drain structure, and furthermore in case it is intended to locate the respective drain outputs at this upper surface of the chip for the purpose of wiring, the resulting structure will become almost impractical so long as a cconventional arrangement is employed. The present inventor has discovered that, in order to solve these problems, it is only necessary to adopt a structure such that an SIT is constructed in normal type structure, and that its drain is drawn out, to serve as a sub-drain, laterally through the chip, and also that the sub-drain is electrically drawn out as an upper-located drain via a high resistivity region having the same conductivity type.

Employment of a plurality of Schottky drains is effective to provide a plurality of independent outputs.

The present invention will be described in further detail with respect to some embodiments by referring to the accompanying drawings.

BRIEF DESCRIPTION OF THE DRAWINGS

FIGS. 1A, 1B and 1C are a diagrammatic top plan view, a diagrammatic sectional view and an equivalent circuit, respectively, of an embodiment for explaining the basic principles of the present invention.

FIGS. 13A, 13B and 13C show a further embodiment of the present invention, in which:

FIG. 13A is a diagrammatic plan view; and

FIGS. 13B and 13C are diagrammatic sectional views taken along the lines XIIIB—XIIIB and XIIIC—XIIIC in FIG. 13A, respectively.

FIGS. 14A and 14B show a further embodiment of the present invention, in which:

FIG. 14A is a diagrammatic plan view; and

FIG. 14B is a diagrammatic sectional view taken along the line XIVB—XIVB' in FIG. 14A.

DETAILED DESCRIPTION OF THE PREFERRED EMBODIMENTS

Figure 1C:
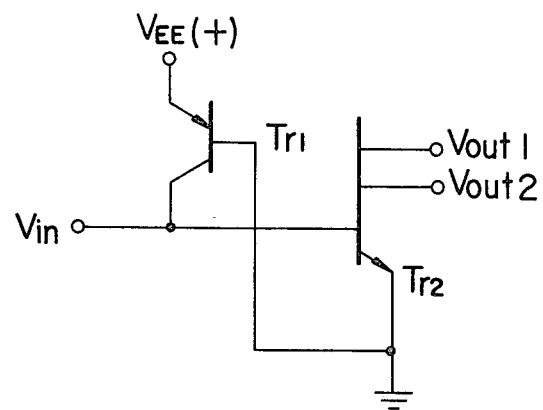

In FIGS. 1A and 1B which show the basic principles of the present invention, on the upper surface of a p-type semiconductor substrate 1 made of Si or GaAs, there is formed an n+ type sub-drain embedded region 2, and on top thereof, there is formed an n− type epitaxial layer 3. It should be understood that, hereinafter the semiconductor body including this epitaxial layer will be called a semiconductor wafer. From the upper surface of said n− type epitaxial layer 3, there are formed a p+ type emitter region 5 and a p+ type collector region concurrently serving as a gate region 4 by relying on diffusion technique, ion implantation technique or like technique. Furthermore, an n+ type base contact region 7, an n+ type source region 6 and n+ type drain regions 8 and 9 are formed by ion-implantation, diffusion or like techniques. On top of these respective regions which are formed in the epitaxial layer, there are formed an injector (emitter) electrode 5', a ground (base-source) electrode 6' and drain electrodes 8' and 9'. Also, on the entire bottom surface of the substrate 1, there is formed an electrode 1'. It should be noted, however, that the provision of this electrode on the bottom surface of the substrate 1 is not always necessary. Reference numeral 10 in these Figures represents an insulating film. In case the p-type semiconductor substrate is made of silicon, this insulating film may be formed of $SiO_2$, $Si_3N_4$, $Al_2O_3$, AlN and like substances, or their mixture or their composite insulating film. In case, however, the substrate is made of GaAs, the insulating film is made of, for example, $GaO_xN_y$. Though not shown, the gate electrode to which is inputted an input signal is formed at an appropriate position on the gate region 4.

In these figures, two drains are shown. It should be understood, however, that the number of the drains may be increased or decreased depending on the requirement.

Also, it is possible to provide a split-gate structure which is proposed by the present inventor by dividing the p+ type gate region 4 into two portions, one of which may be used as a floating gate or may be grounded. For example, in case the gate region is divided into two portions, and one of these two portions is grounded, the effective gate region subjected to potential variation becomes only one half, and accordingly the effective gate capacitance becomes half, and moreover the minority carriers which are injected into the channel region is efficiently pulled out by the grounded gate region to reduce the storage effect, so that a higher-speed operation is made feasible.

An equivalent circuit of the structure shown in FIGS. 1A and 1B is shown in FIG. 1C. An injector transistor Tr1 is constructed by p+ type emitter region 5, n+ type base contact region 7, n− type base region 3' and p+ type collector region 4. Isolation region 20 is formed adjacent to the base contact region 7. An inverter transistor Tr2 is constructed by n+ type source region 6, the p+ type gate region 4, the n− type channel region 3", the n+ type sub-drain region 2, the n− type region 3, and the n+ type drain regions 8 and 9. The injector transistor supplies a load current. An input signal is applied to the gate electrode of the inverter transistor. More particularly, if the input signal is of a low level, the current from the injector transistor Tr1 is caused to flow into an input terminal, i.e. into the drain region of the preceding stage, so that the inverter transistor Tr2 is rendered "off". In case, however, the input signal is of a high level, the current of the injector transistor Tr1 is injected into the gate region of the inverter transistor Tr2, so that the gate potential is elevated and the inverter transistor is rendered "on". These operations are similar to those of known IIL.

Since the inverter transistor Tr2 is of the normal type, it is easy to form an intrinsic gate point at a site sufficiently close to the source region. Thus, it is possible to set the series resistance from the source region to the intrinsic gate sufficiently low, and also to set the distance from said intrinsic gate to the drain region at a desired value, and furthermore the channel region may be made into a shape diverging toward the drain region. As a result of these considerations, it is possible to make the transconductance $g_m$ of the inverter transistor large, and to make the capacitance between the gate region and the source region small and also to make the capacitance between the gate region and the drain region small, and thus the frequency characteristic becomes very much improved, so that the operation speed is improved accordingly. At the same time therewith, the resistance at the conducting time is very small, and thus the driving ability can be intensified, and fan-outs can be taken in a large number.

In the structure shown in FIG. 1, the output drain electrode is formed by an n+ type region. It should be understood, however, that the output drain electrode may be formed by Schottky electrode.

Also, vertically elongated output drain regions are provided in laterally adjacent rows in FIG. 1A. According to such structure, however, there may arise such inconvenience that the amount of current will decrease in the drain region 9 which is located farther from the source region. For avoiding such inconvenience, it is only necessary to adopt some other arrangement in which the amount of current flow in the respective drains is equalized. For example, instead of disposing the n+ type drain regions in vertically extending rows, they may be arranged in the form of parallel horizontal rows consisting of horizontal elongated drain regions in the plan view of FIG. 1A.

In FIG. 1B, in case there flows a punching-through current between the p+ injector region 5 and the substrate 1, and in case, accordingly, there is inconveniently caused unnecessary dissipation of power, it is only necessary to provide a low resistivity region of an opposite conductivity type between this p+ type region 5 and the substrate 1 to suppress the flow of punching-through type current, as will be explained later.

Also, in the embodiment shown in FIG. 1, gate regions 4 are shown to completely surround the source region and the channel region of the inverter transistor. It should be understood, however, that the arrangement of the gate regions do not necessarily follow this pattern. More particularly, it is also effective to make the gate structure into a split-gate structure by dividing the gate region 4 into two regions, one of which, i.e. the one which functions as a collector of a lateral bipolar transistor, is used as an active (driving) gate, and the other one may be used as a passive (non-driving or floating) gate or it may be coupled directly to the source region. In such split-gate structure, the static capacitance of the driving gate decreases, and it is possible to have the passive gate absorb those minority carriers injected from the active gate region into the channel region. Accordingly, the minority carriers are never stored for an extended period of time, so that the operating speed becomes extremely high.

The advantage of the IIL type logic circuit is found in that a wired logic can be taken by connecting the output drain region to a drain region of another inverter unit. In constructing such wired logic, it should be noted that, if a plurality of drain regions are provided on the sub-drain region as shown in FIG. 1, isolation between them will become imperfect, so that the desired wired logic will be difficult to obtain. Accordingly, if it is intended to construct a logic by wired coupling, it should be understood that, where the drain region is made of an n+ type region, there will be the necessity that a one-input, one-output type inverter unit be constructed by incorporating such an insulating isolation region 20, as shown in FIGS. 2A and 2B.

Figure 2A:
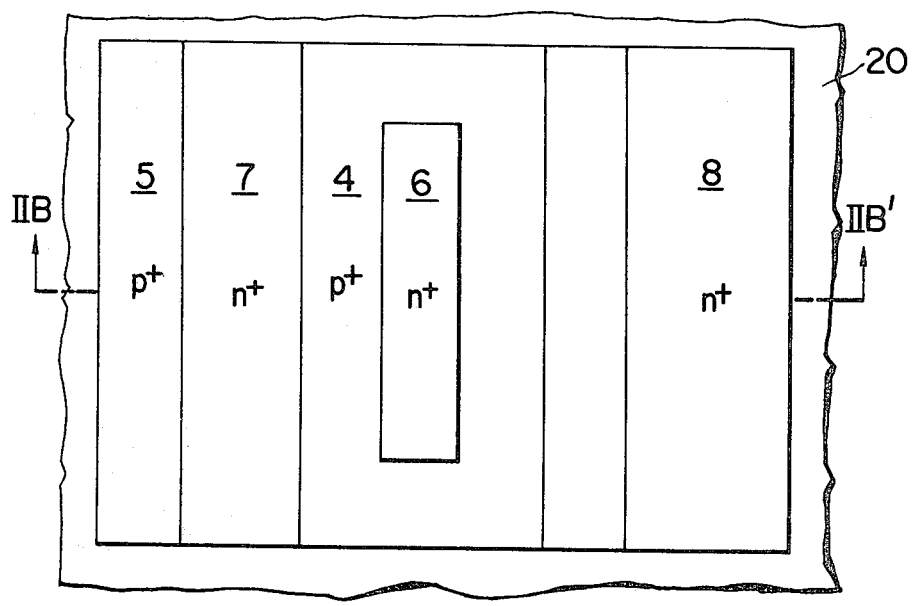
FIGS. 2A, 2B and 2C and FIGS. 3A, 3B and 3C are diagrammatic top plan views, diagrammatic sectional views and equivalent circuits, respectively, of other embodiments of the present invention.
Figure 2B:
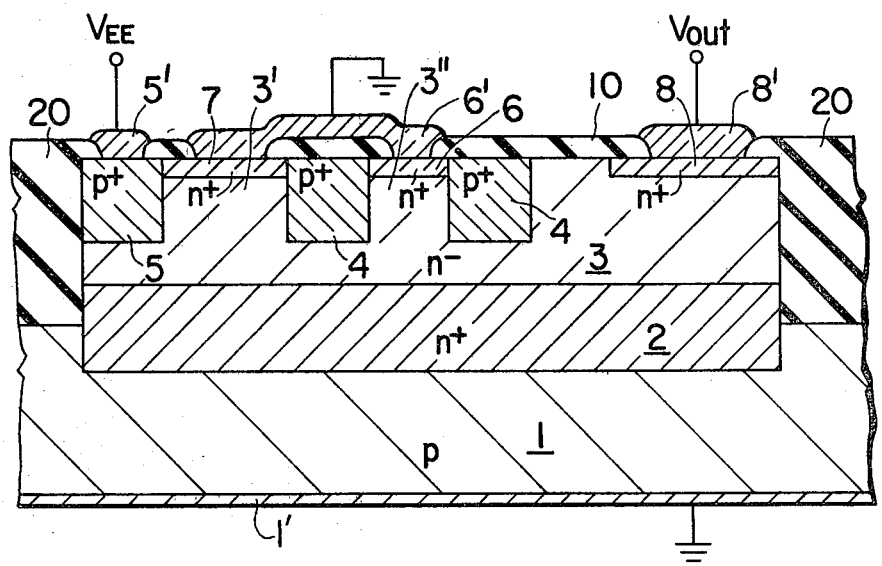
Figure 2C:
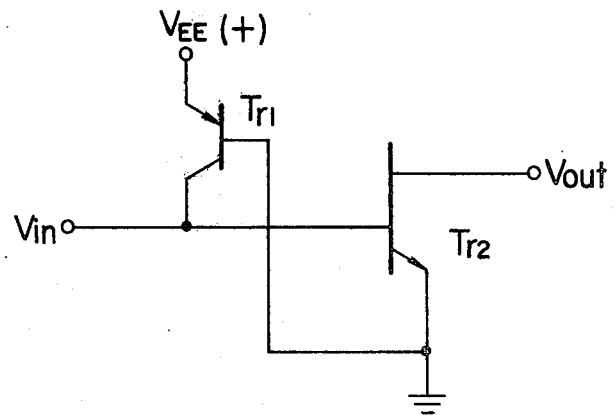
Figure 3A:
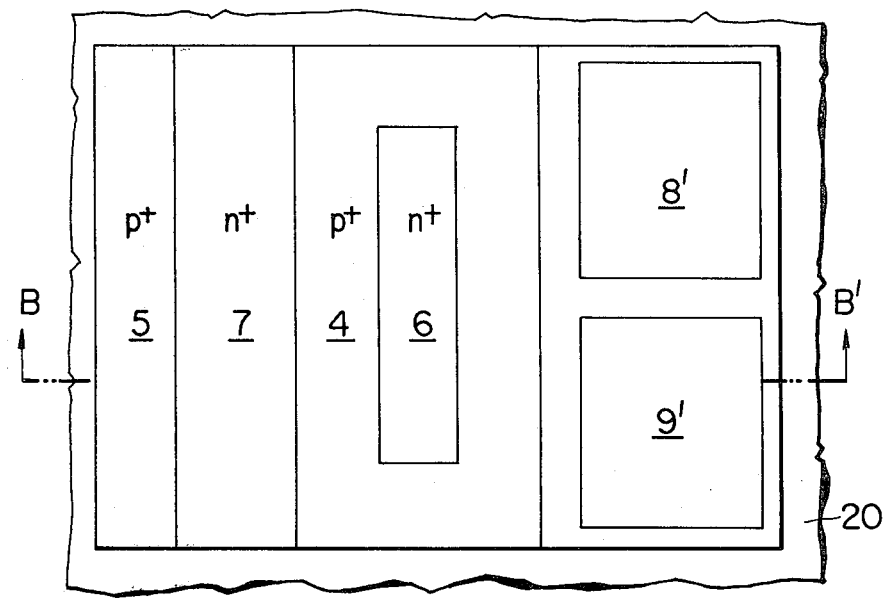
Figure 3B:
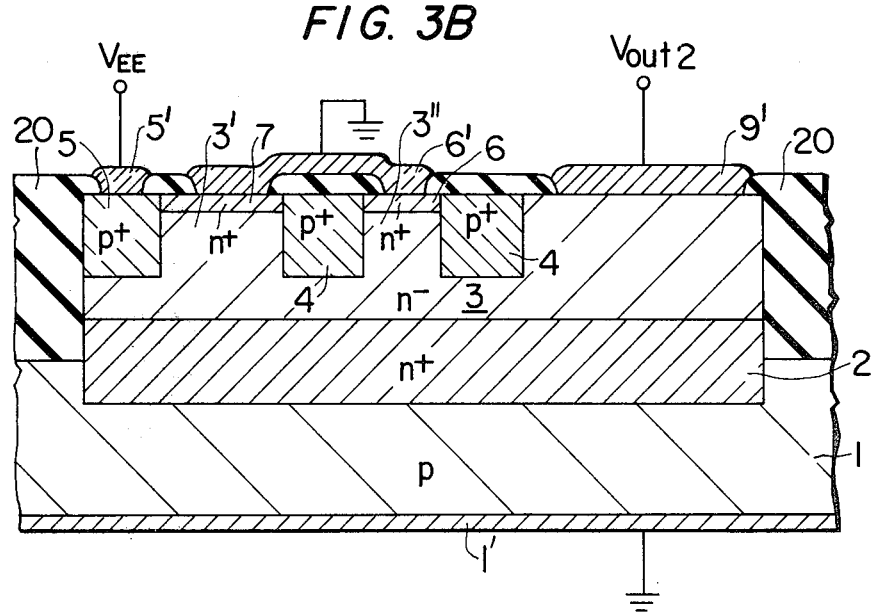

In the embodiment of FIGS. 2A to 2C, an n+ type sub-drain region is extended up to the entire peripheries within the entire isolation region 20 so as to prevent a punch-through type current from flowing between the p+ type injector region 5 and the substrate 1. In this embodiment, the p+ type regions 4 and 5 are formed apart from the sub-drain n+ type region 2. They may be in contact with the sub-drain region 2. Further, a region for preventing the punch-through current may be provided separately from the sub-drain region 2. Other arrangements are similar to those of the embodiment shown in FIG. 1. The width and the impurity concentration of the n− type region 3 sandwiched between the p+ type regions 4 and 5 are selected so that the n+ type contact base region 7 and the n+ type sub-drain region 2 will not become electrically conducting. This n− type region 3 sandwiched between the p+ type regions 4 and 5 are in the state of punching-through, and a potential barrier is produced. In order to solve such problems in a simple way, it is only necessary to form the injector transistor as a MOS-FET. If it is intended to construct a logic circuit by a wired logic arrangement, and if it is intended to form an inverter unit so as to have a multiplicity of outputs, it is only necessary to take out the drain current by Schottky electrodes, instead of by the n+ type regions and the electrodes. Such instance is shown in FIGS. 3A, 3B and 3C.

Figure 3C:
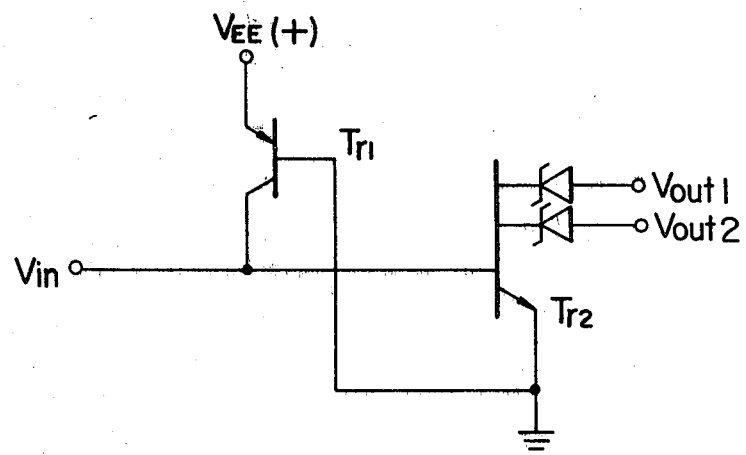

Drain electrodes 8' and 9' are constructed by Schottky electrodes, and an equivalent circuit will be as shown in FIG. 3C. Because of the formation of Schottky diodes, the output terminals $V_{out1}$ and $V_{out2}$ are isolated from each other. Where the semiconductor material is silicon, the injector voltage supply source $V_{EE}$ is set usually at a maximum value of about 1V or less than that. Where the semiconductor is made of GaAs, this value may be a little higher than that. Accordingly, if the forward voltage drop at the Schottky diode of the drain region is excessively great, the difference between logic levels, i.e. between the high level and the low level, becomes small, so that there will be less allowance for noise. When the semiconductor is made of silicon, it will be understood that by adopting a Schottky metal such as Pt, the forward voltage drop $V_f$ will become around 0.6 V, and thus the allowance for noise will become small, whereas if the Schottky metal is Ti, the $V_f$ can be around 0.27 V, so that the device can have a sufficient allowance for noise. Accordingly, it is desirable to employ, for the drain, such Schottky metal as Ti or other metal having a small value of $V_f$. Further, it is known that the Schottky barrier height can be controlled by such means as adopting alloys, controlling the thickness and/or the properties of the interfacial layer, incorporating highly doped surface layers, and so on. The incorporation of a highly doped surface layer may be easily realized by using ion implantation and can change the effective height of a Schottky barrier over a quite large range. Where $V_f$ is about 0.3 V, the voltage of the inverter transistor Tr2 at the time of conduction will become about 0.4 V. By setting the potential at the cut-off time at about 0.6 V ($V_{EE} \approx 0.7$ V) or greater than that, there can be obtained a sufficient allowance for noise. If GaAs is employed as the semiconductor, the noise allowance will become further enhanced, so that the selection range of electrode materials will become broadened. Appropriate selection of the Schottky metal and the manufacturing process thereof will ensure stable operations. In order to make the noise allowance larger, it is desirable to arrange so that no unnecessary voltage drop is present between the drain electrode and the sub-drain region. To this end, the area of the Schottky electrode may be enlarged, or alternatively, in case the Schottky electrode cannot be made large, there may be provided an n+ type region between the sub-drain region and the Schottky electrode by relying on, for example, ion-implantation technique. Or alternatively, there may be preliminarily formed recesses, for example, by removing part of the epitaxial layer, for the attachment of Schottky electrodes, and thereafter Schottky electrodes may be provided there. Since the external sides of the inverter unit are isolated by an insulating material such as SiO$_2$, it should be noted that, for example the p+ type gate region 4 may not be provided completely around the source region 6. In FIG. 3A, arrangement may be provided so that the n+ type source region 6 vertically passes through the p+ type region 4, so as to directly contact the isolation region 20. In FIG. 3A, the drain regions 8 and 9 shown in FIG. 1B are omitted, and Schottky drain electrodes 8' and 9' are in direct contact with an n− type epitaxial layer 3. By making the p+ type gate region 4 into a split-gate structure by adopting such arrangement as discussed above, it is possible to reduce the area of the active gate region, so that the gate capacitance can be reduced accordingly. A plan view of such arrangement is shown in FIG. 4.

Figure 4:
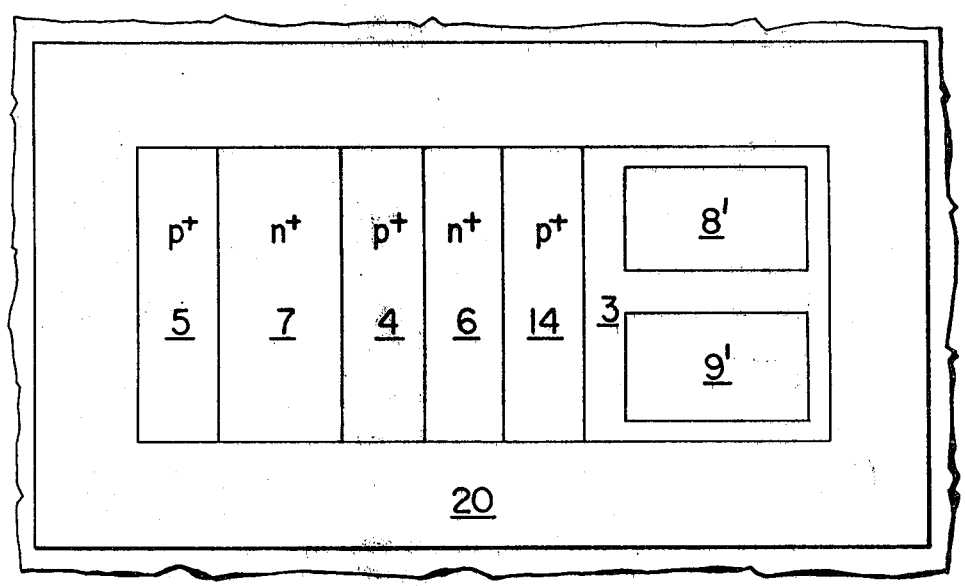
FIG. 4 is a diagrammatic top plan view of another embodiment of the present invention.

In FIG. 4, the gate region 4 is separated into an active gate region 4 and a floating gate region 14. This floating gate region 14 may, literally, have a floating potential, or alternatively it may be directly connected to the source region 6 by a conducting electrode via a certain amount of resistance. In case the floating gate region is electrically connected with the source region by some means, the storage effect of holes injected from the driving gate into the channel region is reduced and the operation speed is improved. For absorbing the minority carriers injected from the active gate region into the channel region as quickly as possible by the floating gate, the impurity concentration of the floating gate region may be increased, and this floating gate region may be connected directly to the source region. It should be understood here, however, that such arrangement may cause a current to easily flow between the driving gate region and the floating gate region, and hence that the current gain of the SIT may drop. If, however, the impurity concentration of the floating gate region is lowered, or if the floating gate region is connected to the source region of the SIT through a resistance such as one formed of polysilicon, a drop of current gain of the SIT can be prevented, though the speed with which minority carriers are absorbed out will become slightly prolonged. In case the impurity concentration of the p type floating gate region is low, the height of the potential barrier for holes will become slightly increased so that the absorption of holes will be limited to some extent. In case a resistance is inserted between the floating gate region and the source region of the SIT, it will be understood that, when a current flows into the floating gate region, the potential thereof will become increased, and thus the in-flow of holes above a certain level will become prevented. An instance wherein the n+ type source region 6 is in direct contact with the insulation region 20 is shown in FIG. 4. It is, however, equally effective to separate the source region 6 and the insulation region 20 by the n− type region 3''.

Figure 5:
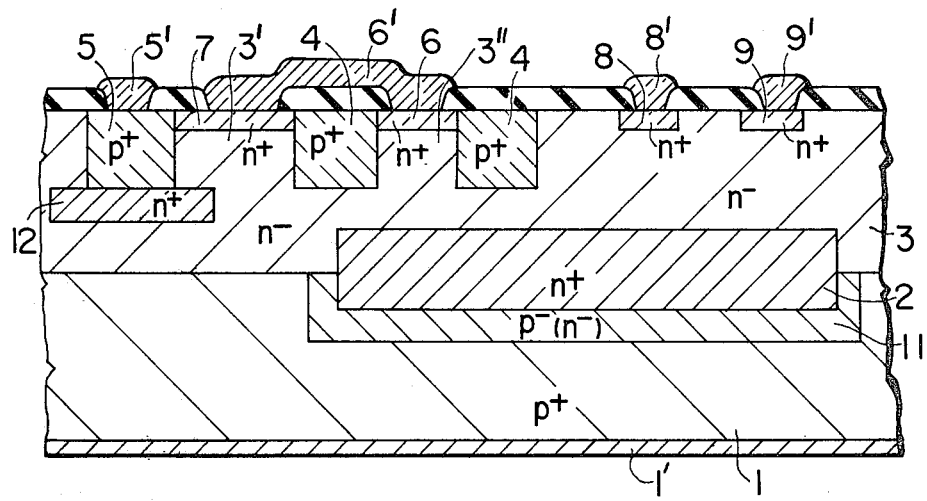
FIGS. 5 and 6 are diagrammatic sectional views of other embodiments of the present invention.

If the area of the sub-drain region in the structure of FIG. 1 is enlarged, this will bring about an increase in the capacitance between this sub-drain region and the substrate, serving as a cause for drop in the operating speed. In order to reduce such effect, it is only necessary to arrange, as shown in FIG. 5, that the substrate is made of a p+ type semiconductor, and that a high resistivity region (which may be either one of n− type, p− type or i) 11 between the substrate p+ type region and the embedded sub-drain n+ type region 2, to ensure that this high resistivity region 11 will become depleted throughout the operation. It should be noted also that there is provided an n+ type region 12 below the p+ type region 5, in order to prevent a punching-through condition from taking place between the p+ type region 5 and the p+ type region 1 and to partially define the effective base region 3'. The incorporation of these regions 11 and 12 may be done in an appropriate manner depending on the desired design of such items as voltage of the voltage supply source, power dissipation and operating speed.

In other embodiments, it is also effective to provide a high resistivity layer between the n+ type sub-drain region and the substrate.

A manner of provision of voltage supply sources has been shown in FIGS. 1C, 2C and 3C. More particularly, these Figures show that a positive voltage $V_{EE}$ is applied to the injector transistor 5, and both the substrate and the source region of the inverter transistor are grounded. Such arrangement, however, is not always necessary. Modification may be provided so that the source region is applied with a negative voltage, and that the injector electrode may be grounded.

Figure 6:
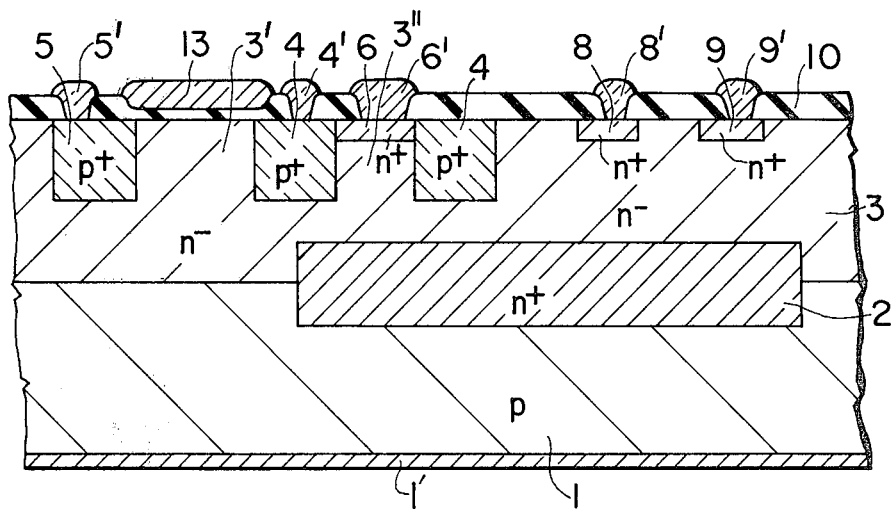

FIGS. 1A through 5 show the instances wherein the injector transistor is made of a lateral bipolar transistor. In FIG. 6, however, there is shown an example in which the injector transistor employs an insulated-gate type field effect transistor. The insulating layer beneath the gate electrode 13 is made thin. In case a sufficient inversion layer is developed in the surface only by the contact potential of the gate electrode 13, this gate electrode 13 may be directly connected to the injector electrode 5'. On the other hand, in case there is not developed sufficient inversion layer only by the contact potential, the gate electrode 13 may be connected directly to the drain electrode 4'. In FIG. 6, p+ type regions 5 and 4 serve as the source region and the drain region, respectively, of an injector insulated-gate type field effect transistor. Incorporation of those regions 11 and 12 and the incorporation of the split-gate structure of the gate region 4 as discussed in FIG. 5 may be carried out also in this embodiment as described above. It is needless to say that the injector transistor may be formed with an insulated-gate type transistor as shown in FIG. 6 in other arrangements shown in FIGS. 2 through 4.

Figure 7A:
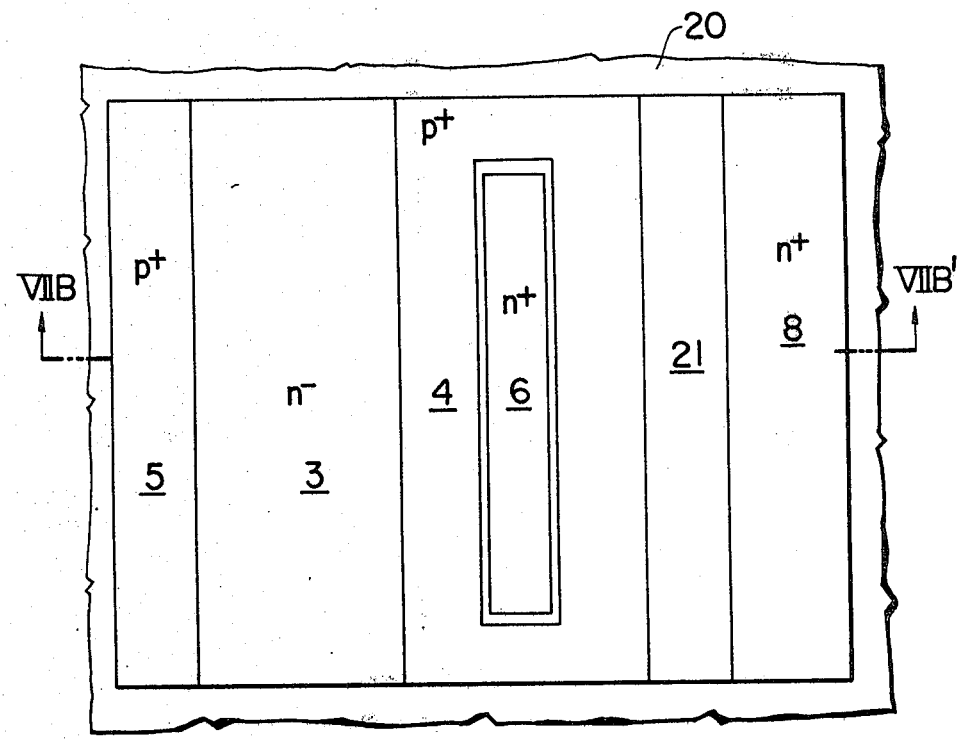
FIGS. 7A, 7B and 7C are a diagrammatic plan views, a diagrammatic sectional view taken along the line A—A' in FIG. 7A, and an equivalent circuit of another embodiment of the present invention.
Figure 7B:
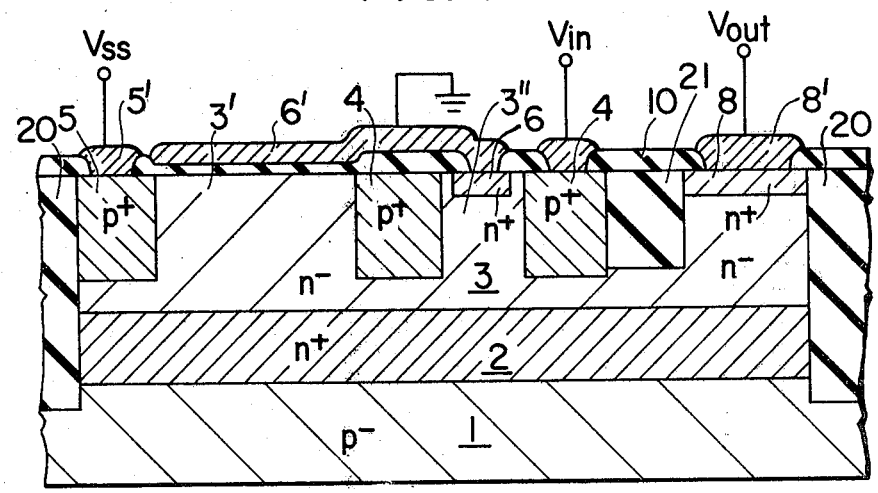
Figure 7C:
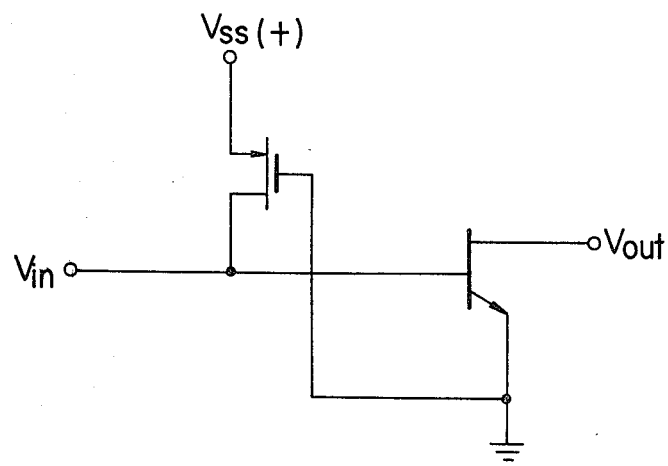

In FIGS. 7A to 7C is shown another embodiment wherein the injector tansistor is made with an insulated-gate type transistor (which will hereinafter be called IG-FET). This is an example of one input and one output. FIG. 7A is a plan view. FIG. 7B is a sectional view taken along the line VIIB—VIIB' in FIG. 7A. FIG. 7C is an equivalent circuit. The gate electrode of this MOSFET is directly connected to the source region of a normal type SIT. In this example, there is no fear at all that the gate region of the injector transistor will become electrically connected (short-circuited) with the sub-drain region of the inverter transistor. Since this is an instance of one output, the drain current is derived by an ohmic electrode 8'. Numeral 20 represents an isolation region such as SiO$_2$ between respective units. Another insulating region 21 is inserted for isolation between the gate region of the normal type SIT and the n+ type region 8 assigned for deriving drain current. Along therewith, this region 21 has the effect of suppressing the minority carrier injection from the gate region of this SIT. Accordingly, unnecessary minority carrier injection is suppressed, so that the current gain of the SIT improves, and the storage effect of the minority carriers becomes reduced, and the operating speed is enhanced. $V_{ss}$ represents a voltage supply source. $V_{in}$ represents an input voltage, and $V_{out}$ represents an output voltage. It is also effective to arrange so that the channel region of the IG-FET has an impurity concentration different from that of other part of the epitaxial region 3, by relying on the ion-implantation or like technique. In case, however, the static capacitance between the sub-drain n+ type region and the substrate and/or the conductance at the time of high-speed operation, for example, become problematical, it is only necessary to use a p+ type substrate and to insert a high resistivity layer between the sub-drain region and this substrate.

Figure 8:
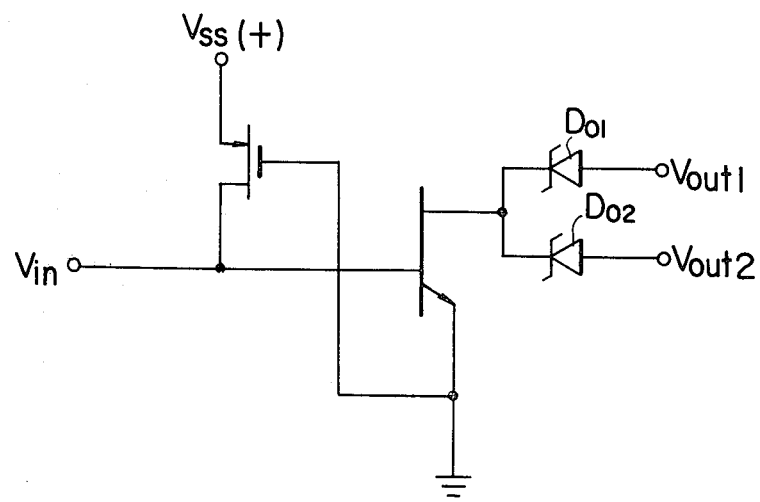
FIG. 8 is an equivalent circuit diagram of another embodiment according to the present invention.

When it is intended to provide a plurality of output terminals, it is only necessary to provide Schottky electrodes (diodes) having a low forward voltage drop directly on the n− type semiconductor region 3. An equivalent circuit of an instance of two outputs and using Schottky drain electrodes is shown in FIG. 8.

The operation of this example is similar to that of known such devices. In case the input $V_{in}$ is at a low level, the inverter SIT is in its cut-off state, so that the current of the injector IG-FET will be allowed to flow to the drain region of the inverter SIT of the preceding stage. When $V_{in}$ is changed to a high level, the inverter SIT will be reverted to a conducting state, so that the output voltage $V_{out}$ will be changed to a low level. The current of the injector IG-FET will flow into the gate region of the inverter SIT.

Figure 9:
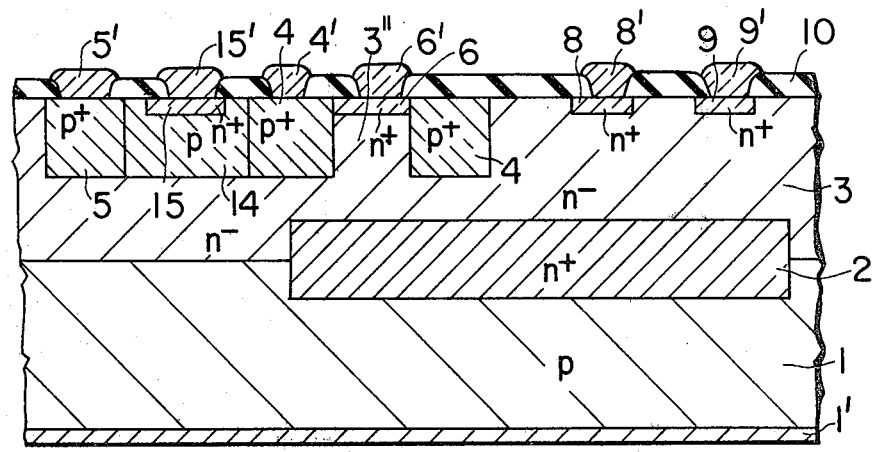
FIGS. 9 and 10 are diagrammatic sectional views of still other embodiments of the present invention.

FIG. 9 shows an embodiment wherein a junction field effect transistor is employed as an injector transistor. A p+ type region 5 serves as a source region. A p type region 14 serves as a channel region. An n+ type region 15 serves as a gate region. An n− type region 3 forms a back-gate. A p+ type region 4 serves as the gate region of the inverter transistor and concurrently serves as the drain region of the injector transistor. In FIG. 9, 5′ and 15′ represent a source electrode and a gate electrode, respectively. Other parts are similar to those of the preceding embodiments. Depending on the impurity concentration and the dimensions of the p type region 14, the gate electrode 15′ may, in some instance, be directly connected to the electrode 5′, or directly to the electrode 4′. The structure of this injector transistor can be applied in other embodiments.

Figure 10:
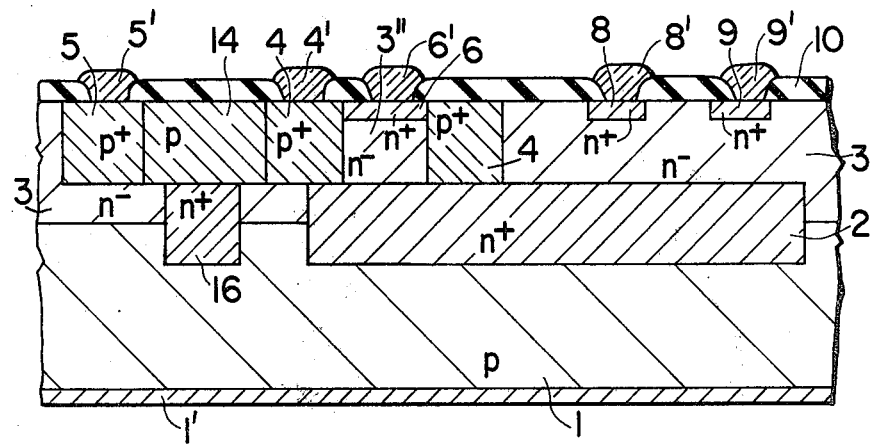

FIG. 10 shows an embodiment wherein a field effect transistor having a floating gate is employed as an injector transistor, and the gate region of the inverter static induction transistor is arranged to reach a sub-drain region which is embedded in the wafer. An n+ type region 16 is formed beneath a p type region 14 which serves as the channel region of the injector transistor, and this region 16 is used as a floating gate region. This n+ type region 16 can be formed at the same time with the n+ type region 2. A gate region and a gate electrode similar to those employed in the embodiment of FIG. 9 may be formed above the channel region 14. In the instant embodiment, the p+ type region 4 reaches the embedded region 2, and the n− type region 3″ which serves as the channel region is isolated from the n− type region 3. This arrangement improves the isolation of the inverter transistor, and along therewith it has the advantage that, when the gate region 4 is forwardly biased, those holes injected from the gate region into the surrounding n type region are directed effectively toward the n− type channel region 3″.

Next, the structure and the impurity concentration according to the present invention will be briefly explained below. Let us now suppose that the distance between the gate regions of the inverter transistor which in the present invention is comprised of an SIT is designated as $2a$ (the width of the n− type region 3″ located between the p+ type gate regions 4), and that the impurity concentration of the n− type channel region 3″ is designated as $N_D$. In order to arrange so that the channel region becomes sufficiently pinched off only by the contact potential at the p+n− junction and that accordingly a high potential barrier may be developed within this channel region, if the semiconductor employed is silicon, the following formula will be followed:

$$N(2a)^2 < 2.4 \times 10^{15} \text{ cm}^{-3}.$$

It should be noted here that this $2a$ is scaled in μm unit. More specifically, if $2a \times 1$ μm, it is preferable to set N at $2.4 \times 10^{15}$ cm$^{-3}$ or less. In case $2a \times 2$ μm, it is preferable to set N at $6 \times 10^{14}$ cm$^{-3}$ or smaller. In very short channel structures, $N.(2a)^2$ requires to be made smaller as compared with the above-mentioned conditions, as the distance between the source region and the drain becomes smaller. This is important for realizing a prefectly "off" state of the transistor under the application of a certain drain voltage. In case the semiconductor is GaAs, the contact potential difference (built-in potential) at the p+n junction becomes large, so that the above-mentioned conditions will become deflected toward the large value side. The distance between the source region and the drain region is, for example, about 0.5 μm up to about 4 μm. In case the semiconductor employed is silicon, the n+ type embedded sub-drain region is constructed by the diffusion or like technique of, for example, As, P, or Sb. However, in order to minimize the surface resistance, the employment of As is desirable. The p+ type region may conveniently be formed by doping boron (B). The n+ type region located at the surface may be formed either by the diffusion of As, P, Sb or like substance, or by ion-implantation of these substances. The impurity concentrations may be about $10^{18} \sim 10^{21}$ cm$^{-3}$ for both the n+ type region and the p+ type region. The impurity concentration of the p type substrate may be about $10^{14} \sim 10^{16}$ cm$^{-3}$, and that of the p+ type substrate may be about $10^{17} \sim 10^{20}$ cm$^{-3}$. The impurity concentration of the n− type or p− type high resistivity region may be about $10^{12} \sim 10^{15}$ cm$^{-3}$. The p+ type region and the n+ type region, in case of GaAs, are formed by Be, Zn, Cd or like substances or by S, Sn, Te, Si or like substances. In case of GaAs, the p type substrate 1 may conveniently be substituted by a substrate made of a material having a semi-insulating nature.

The current gain of the normal type SIT can be very great as compared with that of an upside-down type SIT. For example, a current gain of about several hundred can be easily provided. In the low current region where the carrier injection from the gate region is small, the value will easily reach several thousands. Accordingly, when the voltage of the gate region of the inverter SIT has elevated up to a predetermined high level, a constant injector current will cause an unnecessary current to flow into the gate region, so that unnecessary minority carriers will be injected into the channel region. In other words, the minority carrier storage effect will become prominent, so that the operation speed will drop. The injector transistor may be provided with a property of varying the level of current. However, in case the current of the injector transistor varies markedly, the frequency characteristic of the injector transistor will become associated with the operation speed, so that the operation speed will become lowered.

Figure 11:
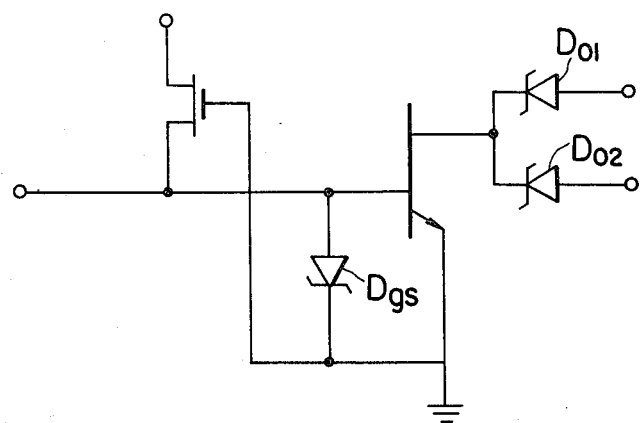
FIGS. 11 and 12 are equivalent circuit diagrams of other embodiments of the present invention.

In order to eliminate the above-mentioned inconvenience, it is effective to connect a Schottky diode $D_{gs}$ between the gate region and the source region of the inverter SIT as shown in FIG. 11 and to arrange so that its forward voltage drop is in agreement with the predetermined high voltage level of the gate region. The injector current after the elevation of the gate voltage up to a predetermined level will then be allowed to flow through the Schottky diode $D_{gs}$. The provision of said Schottky diode $D_{gs}$ may be carried out by constructing a Schottky diode locally in the source region of the SIT, and by directly connecting this diode to the gate region.

Figure 12:
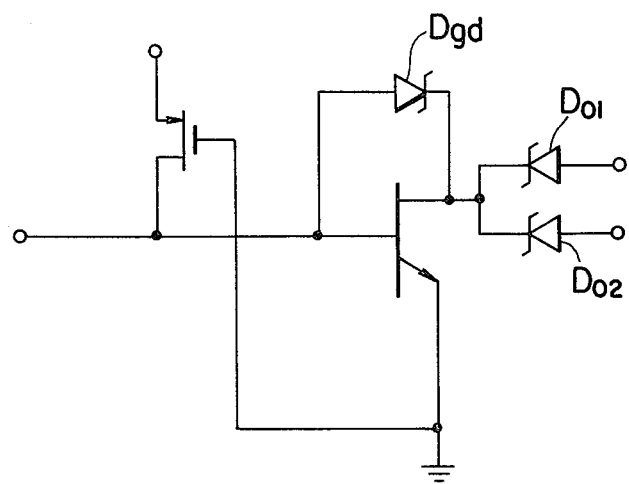

Similar effect can be materialized by the insertion of a Schottky diode $D_{gd}$ between the gate region and the drain region of an inverter SIT as shown in FIG. 12. After the gate has arrived at a predetermined potential, most of the injector current will pass through the Schottky diode $D_{gd}$, and then flow between the drain region and the source region of the SIT. This Schottky diode $D_{gd}$ may be arranged so that a Schottky diode is constructed in the drain current deriving region of the SIT, and then this diode is directly connected to the gate region. According to this arrangement, the gate-drain voltage of the inverter SIT is substantially fixed at the forward voltage drop of the Schottky diode $D_{gd}$ and thus there will be never applied an unnecessarily deep bias between the gate region and the drain region. In the example of FIG. 12, the forward voltage drop of the Schottky diode $D_{gd}$ naturally requires to be greater than that of $D_{01}$ and $D_{02}$.

Figure 13A:
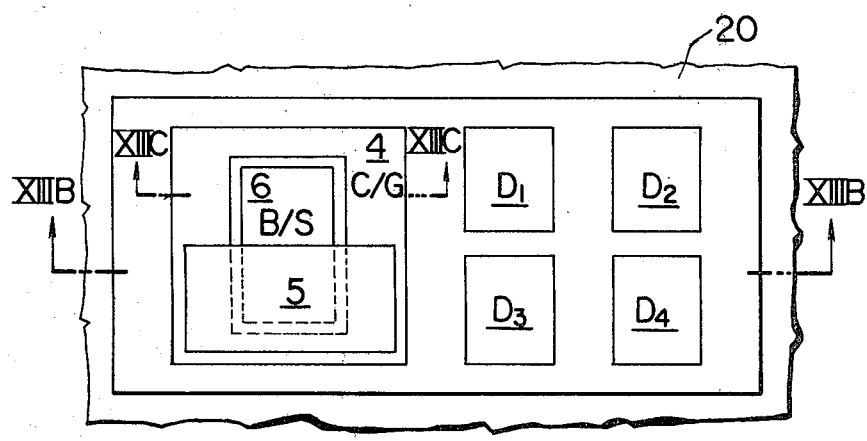
Figure 13B:
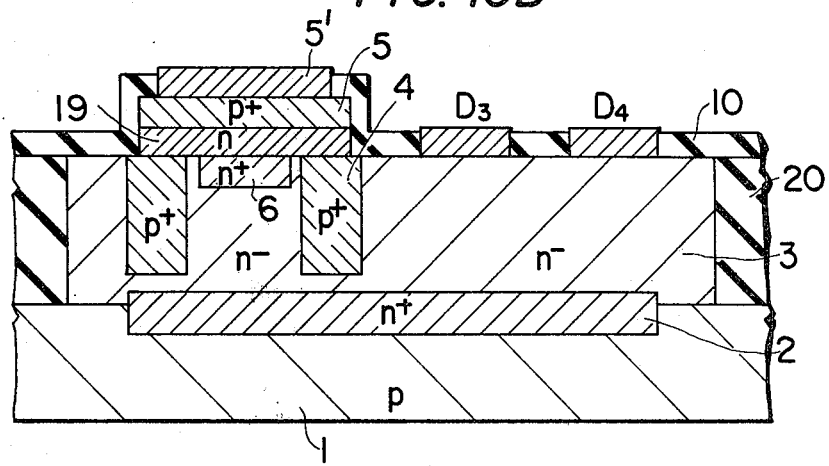
Figure 13C:
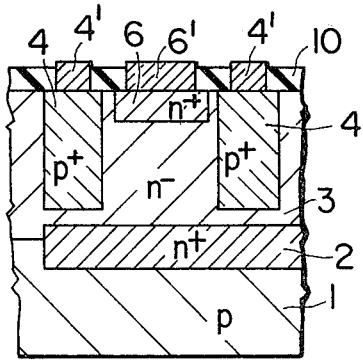

In FIGS. 13A, 13B and 13C is shown another embodiment of IIL type structure. The inverter transistor has a structure similar to that of the preceding embodiment. However, the injector transistor is formed on top of the inverter transistor. In FIG. 13A, other electrodes than the Schottky drain electrode and insulating films are omitted and not shown. As the first step, an n-channel inverter transistor, like in the preceding embodiment, is formed within a semiconductor wafer. Thereafter, locally on top of a p+ type gate region 4 and an n+ type source region 6, there are formed an n type base region 19 and a p+ type emitter region 5 by, for example, selective epitaxial growth technique. An emitter electrode 5' is formed on top of the emitter region 5 (see FIG. 13B). A source electrode 6' and a gate electrode 4' are formed on the exposed surfaces of the source region 6 and the gate region 4 of the inverter transistor, respectively (see FIG. 13C). The structure illustrated is schematic, and is locally exaggerated. It will be clear to those skilled in the art that various modifications and alterations may be possible. For example, the base region 19 may be formed wide so as to be in contact with the source region 6 with a large area, but an emitter region or an emitter electrode may be small only above the gate region 4. An equivalent circuit of this structure is similar to that shown in FIG. 3C, except that the fan-out is four in this embodiment. In this embodiment, an injector transistor is formed on an inverter transistor. Accordingly, the base region of this injector transistor is automatically connected to the source region of the inverter transistor, and thus it is extremely easy to electrically isolate the emitter region 5 of the injector transistor from the respective regions of the inverter transistor. Also, it is easy to enhance the injection efficiency of the injector transistor close to 1 (one) by, for example, adjusting the ratio of areas between the gate region which is contiguous with the base region 19 and the source region, or by forming an emitter region 5 only above the gate region 4.

Figure 14A:
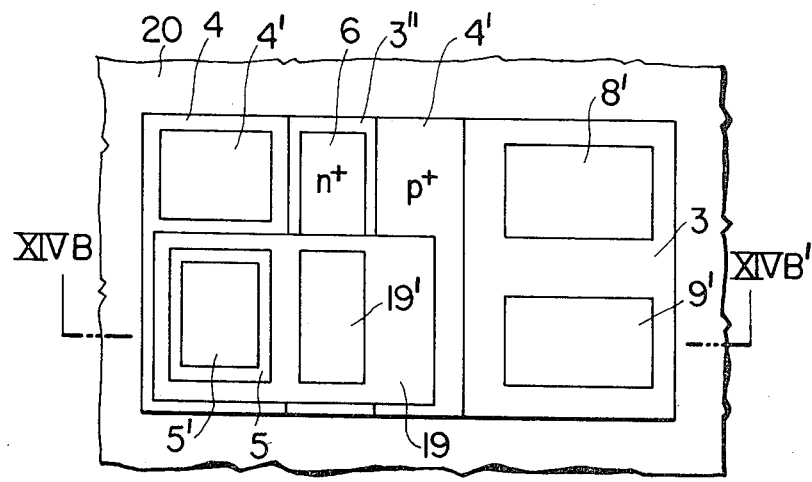
Figure 14B:
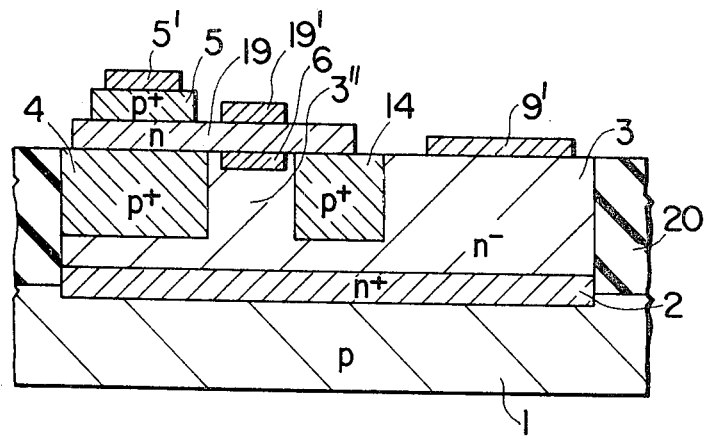

FIGS. 14A and 14B show a further IIL type embodiment, in which an injector bipolar transistor is formed on an active gate region of an inverter static injection transistor.

In these Figures, an inverter static induction transistor is formed similar to the embodiment of FIG. 4. Namely, an n+ type low resistivity sub-drain region 2 is formed in the surface portion of a p type substrate 1, and an n− type high resistivity epitaxial layer 3 is grown thereon. A p+ type active gate region and a p+ type passive gate region 14 are formed deeply in the n− type epitaxial layer 3 and a shallow n+ type source region 6 is formed between these gate regions 4 and 14. A deep isolating region 20 is formed around the transistor structure described above and reaches the substrate 1 for isolating the sub-drain region 2 and also the n− type drain-like region 3 from the outside with the cooperation of the substrate 1 of the opposite conductivity type.

An n type base region 19 is formed on the active gate region 4 and the source region 6. This n type region 19 also covers part of the n−type channel region 3'' and the passive gate region 14. A p+ type emitter region 5 is formed on the n type base region 19 but only in the area located above the active gate region 4.

An injector (emitter) electrode 5' and a base/source electrode 19' are formed on the emitter region 5 and the base region 19, respectively. A pair of Schottky drain electrode 8' and 9' are formed on the n− type region 3.

The impurity concentration and the dimensions of the channel region 3'' defined by the gate regions 4 and 14 are so selected so as to insure that the depletion layers growing from the pn junctions between the n− type channel region 3'' and the p+ type gate regions 4 and 14 can pinch off the channel region 3'', but nevertheless the potential barrier formed by these depletion layer never becomes unsensitive to the drain voltage with respect especially to the barrier height, and also to its length. Namely, when the sub-drain region 2 is at a higher forward voltage, the height of the potential barrier formed by those depletion layers lessens to realize barrier height control by the drain voltage. The base region 19 has a thin thickness so that the emitter injection efficiency is rendered high, and the resistance between the base electrode 19' and the source region 6 is rendered very small. An electrode 4' shown in FIG. 14A is a gate electrode to be used for external connection. In this embodiment, the substantial portion of the injector bipolar transistor is formed only on the active gate region of the split gate configuration. Therefore, the emitter injection efficiency is very high and the gate capacitance is low to achieve low power, high speed operation. Furhtermore, the source electrode of the inverter transistor is formed on the base region to control the source potential through the base region. This arrangement, however, gives little effect to the porformance of the inverter transistor itself and contributes to making the manufacture of the device somewhat easier. Out-diffusion or auto-doping from the p+ type gate regions 4 and 14 and from the n+ type source region 6 may be effectively utilized in the formation of the n type layer 19. Namely, the resistivity of the n type layer 19 may be increased in those areas disposed on the p+ type regions by out-diffusion of the opposite conductivity type impurities, and the resistivity may be reduced in that area disposed on the n+ type region by out-diffusion of impurities of similar conductivity type. Thus, the source resistance of the inverter transistor and the capacitance between the source electrode 19' and the active gate region 4 can be kept very low.

An integrated circuit which employs a normal-type SIT of the present invention serving as an inverter transistor and having its source region formed in the surface of the semiconductor body, and having a sub-drain region formed as an embedded region, needless to say, is not limited to those structures shown in FIGS. 1 through 12. Any structure may be employed provided that the inverter transistor is formed by a normal-type SIT and also that a desired number of drain electrodes are provided on the surface above the embedded sub-drain region. The number of the drain electrode is not limited to single, but it may be two or three or more if Schottky electrodes are employed. Furthermore, a structure having respective regions of reversed conductivity types may be used if the polarities of the voltages of the voltage supply sources are reversed. Also, in the drawings, there have been shown only those inverter units of either one-input, one-output or a multiplicity of outputs. It should be understood, however, that the provision of a plurality of such inverters will enable one to construct any desired logic gate invariably as wired logic.

The integrated circuit employing the normal-type SIT of the present invention can be easily manufactured by relying on known crystal growth technique, diffusion technique, ion-implantation technique and fine processing technique.

The integrated circuit employing, as an inverter transistor, the normal-type SIT of the present invention is able to display the high-speed operation inherent to a normal-type SIT, so that a high packing density and a high-speed operation with a very small power dissipation can be materialized.

What is claimed is:

1. A static induction type semiconductor integrated circuit device containing at least a static induction transistor including a source, a channel, a gate and a drain region, and a field effect transistor, the static induction transistor comprising:
a first semiconductor region of a low resistivity having a first conductivity type;
a second semiconductor region of a high resistivity having said first conductivity type and formed on and adjacent to said first semiconductor region and having a first main surface on that side located away from the side located adjacent to said first semiconductor region;
a third semiconductor region of a low resistivity having said first conductivity type and formed in said first main surface of said second semiconductor region to face a first portion of said first semiconductor region, sandwiching a first portion of said second semiconductor region between this third semiconductor region and said first semiconductor region and serving as a source region;
a fourth semiconductor region having a second conductivity type opposite to said first conductivity type and formed adjacent to at least part to said first portion of the second semiconductor region and serving as a gate region and defining a current path formed with said first portion between said first and third semiconductor regions and effectively isolated from the remaining portion of the second semiconductor region;
at least one charge carrier deriving means formed in said first main surface of said second semiconductor region in a second portion of said remaining portion and facing a second portion of said first semiconductor region; and
means for isolating said first semiconductor region excepting the area exposed to said second semiconductor region, and said field effect transistor having a drain semiconductor region which is merged in said gate region of said static induction transistor.

2. A static induction type semiconductor intagrated circuit device according to claim 1, in which:
said isolating means includes a fifth semiconductor region having said second conductivity type formed on that side of said first semiconductor region located away from both said third semiconductor region and said current deriving means.

3. A static induction type semiconductor integrated circuit device according to claim 2, in which: said isolating means further includes a sixth semiconductor region of a high resistivity region intervening between said fifth semiconductor region and said first semiconductor region.

4. A static induction type semiconductor integrated circuit device according to claim 1, in which:
said current deriving means has a structure having a seventh semiconductor region of a low resistivity having said first conductivity type and formed in said first main surface of said second semiconductor region.

5. A static induction type semiconductor integrated circuit device according to claim 4, further comprising:
an insulating region formed between said seventh semiconductor region and said fourth semiconductor region.

6. A static induction type semiconductor integrated circuit device according to claim 1, in which:
said current deriving means of said static induction transistor includes plural members each comprising a Schottky metal electrode formed in contact with said second semiconductor region.

7. A static induction type semiconductor integrated circuit device according to claim 1, in which:
said fourth semiconductor region substantially surrounds said third semiconductor region and said first portion of the second semiconductor region.

8. A static induction type semiconductor integrated circuit device according to claim 1, in which said fourth semiconductor region is divided into a portion located closer to said current deriving means relative to said third semiconductor region, and another separated portion located farther from said charge carrier deriving means relative to said third semiconductor region.

9. A static induction type semiconductor integrated circuit device according to claim 1, in which:
said second semiconductor region of said static induction transistor has a still another portion intervening between said fourth semiconductor region and said first semiconductor region.

10. A static induction type semiconductor integrated circuit device according to claim 1, in which that side of said fourth semiconductor region located closer to said first semiconductor region is in contact with said first semiconductor region.

11. A static induction type semiconductor integrated circuit device according to claim 1, in which:
said field effect transistor further comprises a gate means; said static induction transistor further comprises a source electrode which is in electrical contact with said source region of said static induction transistor and with said gate means of said field effect transistor.

12. A static induction type semiconductor integrated circuit device according to claim 1, in which:
said field effect transistor further comprises a channel region which is constituted by a third portion of said second semiconductor region; and
said gate means includes an insulating film formed on said third portion of said second semiconductor region and a conductive electrode formed on said insulating film and electrically connected with said source electrode of said static induction transistor.

13. A static induction type semiconductor integrated circuit device according to claim 1, in which:

said field effect transistor further comprises a semiconductor channel region of said second conductivity type formed within said second semiconductor region, and a semiconductor gate region of said first conductivity type formed adjacent to said semiconductor channel region and electrically connected with said source electrode of said static induction transistor.

14. A static induction type semiconductor integrated circuit device according to claim 1, further comprising:
a Schottky diode connected between said source region of said static induction transistor and said gate region of said static induction transistor for allowing a current to flow when the bias voltage between said source and gate region exceeds a threshold voltage.

15. A static induction type semiconductor integrated circuit device according to claim 1, further comprising:
a Schottky metal electrode formed on said second portion of said second semiconductor region of said static induction transistor and connected to said gate region of said static induction transistor.

16. A static induction type semiconductor device including a junction gate static induction transistor and an insulated-gate type transistor formed in a monolithic semiconductor chip, the static induction transistor comprising:
a semiconductor substrate of one conductivity type;
an epitaxial semiconductor layer of the other conductivity type opposite to said one conductivity type having a high resistivity and formed on said substrate;
a heavily-doped sub-drain semiconductor region of said other conductivity type embedded in the semiconductor chip in the vicinity of the interface between said substrate and said epitaxial layer and being in contact with said epitaxial layer;
a heavily-doped gate semiconductor region of said one conductivity type formed in said epitaxial layer, extending from a surface of said epitaxial layer toward said substrate above a portion of said sub-drain region, and defining a current channel region formed of a first portion of said epitaxial layer;
a heavily-doped source semiconductor region of said other conductivity type formed in said channel region adjacent to said surface of said epitaxial layer;
at least one Schottky metal drain electrode formed on a second portion of said epitaxial layer located above another portion of said sub-drain region, the insulated-gate type transistor comprising:
a third portion of said epitaxial layer located adjacent to said gate region and consisting of a channel region of the insulated-gate type transistor;
an insulating film formed on said third portion of said epitaxial layer;
a conductive gate electrode formed on said insulating film;
a heavily-doped other source semiconductor region of said one conductivity type formed in said epitaxial layer located adjacent to said third portion and adjacent to said surface of the epitaxial layer; and
said gate region of said static induction transistor constituting a drain region of the insulated-type transistor.

17. A static induction type semiconductor integrated circuit device containing at least a static induction transistor including a source, a channel, a gate and a drain region and a bipolar transistor including an emitter, a base and a collector, the static induction transistor comprising:

a first semiconductor region of a low resistivity having a first conductivity type;
a second semiconductor region of a high resistivity having said first conductivity type and formed on and adjacent to said first semiconductor region and having a first main surface on that side located away from the side located adjacent to said first semiconductor region;
a third semiconductor region of a low resistivity having said first conductivity type and formed in said first main surface of said second semiconductor region to face a first portion of said first semiconductor region, sandwiching a first portion of said second semiconductor region between this third semiconductor region and said first semiconductor region and serving as a source region;
a fourth semiconductor region having a second conductivity type opposite to said first conductivity type and formed adjacent to at least part of said first portion of the second semiconductor region and serving as a gate region and defining a current path formed with said first portion between said first and third semiconductor regions and effectively isolated from the remaining portion of the second semiconductor region;
at least one current deriving means formed in said first main surface of said second semiconductor region in a second portion of said remaining portion and facing a second portion of said first semiconductor region; and
means for isolating said first semiconductor region excepting the area exposed to said second semiconductor region, and the bipolar transistor comprising:
a collector semiconductor region which is merged in said gate region of said static induction transistor;
a base semiconductor region having said first conductivity type and disposed at least partially on that surface of said common gate-collector region located opposite to the side facing said first semiconductor region; and
an emitter semiconductor region having said second conductivity type and disposed on that surface of said base region located opposite to the side facing said first semiconductor region,
whereby said bipolar transistor is constructed to protrude from said first main surface of said second semiconductor region.

18. A static induction type semiconductor integrated circuit device according to claim 17, in which said current deriving means of said static induction transistor includes a Schottky metal electrode formed on said second portion of said second semiconductor region.

19. A static induction type semiconductor integrated circuit device according to claim 17, in which said base region is also formed partly on said source region and electrically connected therewith, and said emitter region is formed above part of said gate region.

20. A static induction type semiconductor integrated circuit according to claim 19, in which said gate region includes a first portion and a second portion electrically isolated from each other and said first portion of the gate region includes said part above which said emitter region is formed.

21. A static induction type semiconductor device including a junction gate static induction transistor and a bipolar junction transistor formed in a monolithic semiconductor chip, the static induction transistor comprising:

a semiconductor substrate of one conductivity type;

and epitaxial semiconductor layer of the other conductivity type opposite to said one conductivity type having a high resistivity and formed on said substrate;

a heavily-doped sub-drain semiconductor region of said other conductivity type embedded in the semiconductor chip in the vicinity of the interface between said substrate and said epitaxial layer and being in contact with said epitaxial layer;

a heavily-doped gate semiconductor region of said one conductivity type formed in said epitaxial layer, extending from a surface of said epitaxial layer toward said substrate above a portion of said sub-drain region, and defining a current channel region formed of a first portion of said epitaxial layer;

a heavily-doped source semiconductor region of said other conductivity type formed in said channel region adjacent to said surface of said epitaxial layer; and at least one Schottky metal drain electrode formed on a second portion of said epitaxial layer located above another portion of said sub-drain region, and the bipolar junction transistor comprising:

a base semiconductor region of said other conductivity type formed with at least part of another epitaxial layer formed on said epitaxial layer at least partially on said source and gate regions;

an emitter semiconductor region of said one conductivity type formed adjacent to said base region; and said gate region of the static induction transistor constituting a collector region of said bipolar junction transistor.

22. A static induction type semiconductor device according to claim 16, in which said source region is surrounded by said gate region and separated therefrom with said first portion of the epitaxial layer intervening between said source region and said gate region, and said base region is also in contact with said first portion of the epitaxial layer.

23. A static induction type semiconductor device according to claim 21, in which:

said emitter region is formed with a further epitaxial layer formed on said another epitaxial layer at least partly above said gate region.

24. The device of claim 1 wherein:

said field effect transistor further comprises a semiconductor channel region of said second conductivity type formed within said second semiconductor region.

* * * * *

UNITED STATES PATENT AND TRADEMARK OFFICE
CERTIFICATE OF CORRECTION

PATENT NO. : 4,317,127
DATED : February 23, 1982
INVENTOR(S) : Jun-ichi NISHIZAWA It is certified that error appears in the above-identified patent and that said Letters Patent is hereby corrected as shown below:

Claim 1, column 13, line 46, read "part to" as
--part of--

Claim 16, column 15, line 62, read "insulated type" as
--insulated-gate type--

Signed and Sealed this

Twenty-first Day of September 1982

[SEAL]

Attest:

Attesting Officer

GERALD J. MOSSINGHOFF

Commissioner of Patents and Trademarks